United States Patent [19]
Nagai et al.

[11] Patent Number: 5,223,722
[45] Date of Patent: Jun. 29, 1993

[54] SUPERLUMINESCENT DIODE

[75] Inventors: Yutaka Nagai, Itami; Kenichi Kajiwara, Kamakura, both of Japan

[73] Assignees: Mitsubishi Denki Kabushiki Kaisha, Tokyo; Mitsubishi Precision Kabushiki Kaisha, Kanagawa, both of Japan

[21] Appl. No.: 850,273

[22] Filed: Mar. 12, 1992

[30] Foreign Application Priority Data

Mar. 26, 1991 [JP] Japan ..................................... 3-60640

[51] Int. Cl.⁵ .......................... H01L 33/00; H01S 3/19
[52] U.S. Cl. .................................... 257/96; 257/94; 257/98; 372/45; 372/46
[58] Field of Search ............... 372/45, 50, 46; 357/17; 257/96, 98, 94

[56] References Cited

U.S. PATENT DOCUMENTS

| | | | |
|---|---|---|---|
| 4,821,277 | 4/1989 | Alphonse et al. | 357/17 |
| 4,901,123 | 2/1990 | Noguchi et al. | 357/17 |

FOREIGN PATENT DOCUMENTS

| | | |
|---|---|---|
| 2205365 | 8/1990 | Japan . |
| 2218182 | 8/1990 | Japan . |
| 2249283 | 10/1990 | Japan . |

OTHER PUBLICATIONS

Alphonse et al, "Low Spectral Modulation High-Power Output from a new AlGaAs Superluminescent Diode/Optical Amplifier Structure" Applied Physics Letters, vol. 55, No. 22, Nov. 1989, pp. 2289-2291.

Alphonse et al, "High-Power Superluminescent Diodes", IEEE Journal of Quantum Electronics, vol. 24, No. 12, Dec. 1988, pp. 2454-2457.

*Primary Examiner*—Jerome Jackson
*Attorney, Agent, or Firm*—Leydig, Voit & Mayer

[57] ABSTRACT

A superluminescent diode includes a substrate; a double heterojunction structure including a first conductivity type cladding layer, an undoped or first or second conductivity type active layer, and a second conductivity type cladding layer disposed on said substrate; a first conductivity type cap layer disposed on the second conductivity type cladding layer; and a second conductivity type stripe-shaped diffusion region penetrating the cap layer and reaching into the second conductivity type cladding layer. Current is injected into the active layer through the diffusion region. The stripe-shaped diffusion region extends from a front facet toward but not reaching a rear facet and is inclined an angle in a range from 3 to 20 degrees with respect to the front facet. Accordingly, repetition of reflection and amplification of light having a directionality perpendicular to the facets is decreased and the effective reflection of light from both facets is decreased, resulting in an SLD that can operate stably even in high power output operation without inviting laser oscillation and that can be produced with a high yield.

8 Claims, 9 Drawing Sheets

1 excitation region   2 non-excitation region

SUPERLUMINESCENT DIODE

FIELD OF THE INVENTION

The present invention relates to superluminescent diodes (hereinafter referred to as SLDs) and, more particularly, to SLDs that can operate stably at high power output and that can be produced at high yield.

BACKGROUND OF THE INVENTION

Recently, SLDs, which may be positioned between semiconductor lasers and light emitting diodes, have drawn attention. This light emitting device has a broad width spectrum like the light emitting diode and emits light having output power as high as that of the semiconductor laser. SLDs are useful light sources for fiberoptic gyroscopes, which are installed in inertial navigation systems for detecting positions of air planes or ships at every moment and directing them to their destinations. SLDs can emit low coherent light at high output power with good directionality.

In designing and producing high power SLDs, it is important to prevent laser oscillation and to broaden the spectrum width of spontaneous emission light.

FIG. 6 is a perspective view showing a prior art nonexcitation absorption type SLD. FIG. 7 is a plan view thereof. In these figures, reference numeral 1 designates an n type GaAs substrate. An n type AlGaAs cladding layer 2 is disposed on the substrate 1. An undoped AlGaAs active layer 3 is disposed on the n type AlGaAs cladding layer 2. A p type AlGaAs cladding layer 4 is disposed on the undoped AlGaAs active layer 3. An n type GaAs cap layer 5 is disposed on the p type AlGaAs cladding layer 4. A p side electrode 6 and an n side electrode 7 are disposed on the n type GaAs cap layer 5 and the rear surface of the substrate 1, respectively. A Zn diffusion region 8 penetrates the n type GaAs cap layer 5 and reaches into the p type AlGaAs cladding layer 4. This region 8 operates to form a current injection region in the undoped AlGaAs active layer 3. As shown in FIG. 7, the Zn diffusion region 8 extends perpendicular to and from to the facet a toward and to nearly halfway between the facets a and b along the element length.

Description is given of the operation.

When a forward bias voltage is applied across the p side electrode 6 and the n side electrode 7, i.e., a positive voltage is applied to the p side electrode 6 while a negative voltage is applied to the n side electrode 7, electrons and holes are injected into the active layer 3 beneath the Zn diffusion region 8 and light-emission and recombination of the electrons and holes occur in the active layer 3, whereby spontaneous emission light and induced emission light are emitted from the facets.

FIG. 8 is a plan view of the non-excitation absorption type SLD of FIG. 7, schematically showing light generated in the excitation region c in the active layer 3. As shown by the dashed line in FIG. 8, the light $C_1$, which is generated in the current injection region beneath the Zn diffusion region 8, i.e., the excitation region c, and has a directionality prependicular to the facet b, advances along the direction D and then it is reflected by the facet b. If the reflected light $C_1$ returns into the excitation region c, it is combined with the light $C_2$ having a directionality prependicular to the facet a. Then, the combined light is amplified and again reflected by the facet b and returned to the excitation region c and then further interference and amplification occur. By repeating the reflection and amplification, coherent light is generated, resulting in a laser oscillation. Once the laser oscillation occurs, it is not possible to output low power coherent light with high directionality. In order to avoid such a laser oscillation, the length $l_2$ of the stripe-shaped excitation region c is shortened, so that the light generated in the excitation region c (including the light reflected by the facet a and amplified in the excitation region c) is absorbed in the non-excitation region d. This is called a non-excitation absorption structure. As shown by the dotted line in FIG. 8, the light A having a directionality perpendicular to the facet b is gradually absorbed by the non-excitation region d while traveling therethrough along the direction B and then it is reflected by the facet b. The reflected light is further absorbed by the non-excitation region d and does not return to the excitation region c, whereby spontaneous emission light and induced emission light are emitted from the facet. FIG. 9 shows the output spectra of the SLD shown in FIG. 8 under continuous operation at output power levels of 5 mW and 10 mW in case where the length $l_1$ of the element is 500 microns and the length $l_2$ and the width W of the excitation region are 250 microns and 5 microns, respectively.

FIG. 10 is a perspective view of a prior art angled-stripe type SLD disclosed in 1988, IEEE JOURNAL OF QUANTUM ELECTRONICS, Vol. 24, pages 2454 to 2457, by G. A. Alphonse et al., and FIG. 11 is a plan view thereof. In FIG. 10, reference numeral 9 designates a $SiO_2$ film.

This SLD operates in the similar way as described above. That is, when a forward bias voltage is applied across the p side electrode 6 and the n side electrode 7, spontaneous emission light and induced emission light are emitted from the facets.

In this angled-stripe type SLD, in order to prevent the laser oscillation in the excitation region inside the element thereby to obtain spontaneous emission light and induced emission light emitted from the facets, the stripe-shaped Zn diffusion region 8 is angled by 5° with respect to the facets and the length of the element is twice as long as that of the SLD shown in FIG. 6, i.e., 1000 microns. FIG. 12 is a plan view of the SLD shown in FIG. 10, schematically showing light generated in the excitation region $c_1$ in the active layer 3. For example, the light $E_1$ advances along the excitation region $c_1$ and is output as the light $E_2$. At this time, although the light $E_3$ is generated as a reflection component of the light $E_1$, since the excitation region c is inclined by 5° with respect to the facets, this reflection component $E_3$ does not again return to the excitation region $c_1$ but it is absorbed by the nonexcitation region $d_1$, so that no laser oscillation occurs. In addition, since the element length $l_1$ is as long as 1000 microns, the lights $F_1$ and $F_3$ having directionality perpendicular to the facets $a_1$ and $b_1$, respectively, which may contribute to the laser oscillation, are reflected by the facets $a_1$ and $b_1$ and absorbed by the non-excitation region $d_1$ before returning into the excitation region $c_1$, so that no laser oscillation occurs. FIGS. 14(a) to 14(c) show output spectra of the SLD shown in FIG. 12 under a continuous operation at output power levels of 8 mW, 14 mW and 28 mW, respectively, in case where the element length $l_1$ is 1000 microns and the width W of the excitation region is 5 microns.

In the prior art non-excitation absorption type SLD constituted as described above, a broad spectrum as shown in FIG. 9 can be obtained in the low power output operation at an output power level of 5 mW. However, in the high power output operation at output power level of 10 mW, the intensity of the light generated in the excitation region due to the light-emission and recombination of carriers is increased and the ratio of the light reflected by the facet a and amplified in the excitation region c in FIG. 8 is increased, so that the light is not sufficiently absorbed by the non-excitation region and the reflection and amplification of the light having directionality perpendicular to the facets is repeated, resulting in a laser oscillation.

In the prior art angled-stripe type SLD constituted as described above, since light confinement effect of the stripe-shaped Zn diffusion region 8 in the horizontal direction is poor, modes $F_1$ and $F_2$, which reciprocate between the both facets as shown in FIG. 12, are likely to occur and laser oscillation occurs in high power output operation. Such a laser oscillation can be prevented by further increasing the element length. In this case, however, the increased size of the element results in poor production yield. In addition, although the width W of the Zn diffusion region 8 is 5 microns in the above description, the effective width is about 30 to 40 microns because of the diffusion current. As the result, modes $H_1$ and $H_2$, which reciprocate between the facets as shown in FIG. 13, are likely to occur.

SUMMARY OF THE INVENTION

An object of the present invention is to provide a SLD that can operate stably even in high power output operation without inviting laser oscillation and that can be produced at high yield.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with an aspect of the present invention, a SLD is provided with a stripe-shaped excitation region ended halfway between a front facet and a rear facet and inclined at an angle of 3 to 20 degrees with respect to the facets and a non-excitation region formed in a region other than the excitation region. In this structure, since the stripe-shaped excitation region is ended halfway, the region from the end of the stripe up to the rear facet becomes the non-excitation region and light generated in the excitation region is absorbed by the non-excitation region. Therefore, reflection of light from the rear facet is reduced, resulting in a SLD that can operate stably even in high power output operation without inviting laser oscillation and that can be produced at high yield.

DETAILED DESCRIPTION OF THE PREFERRED EMBODIMENTS

An embodiment of the present invention will be described in detail with reference to the drawings.

Figure 1:
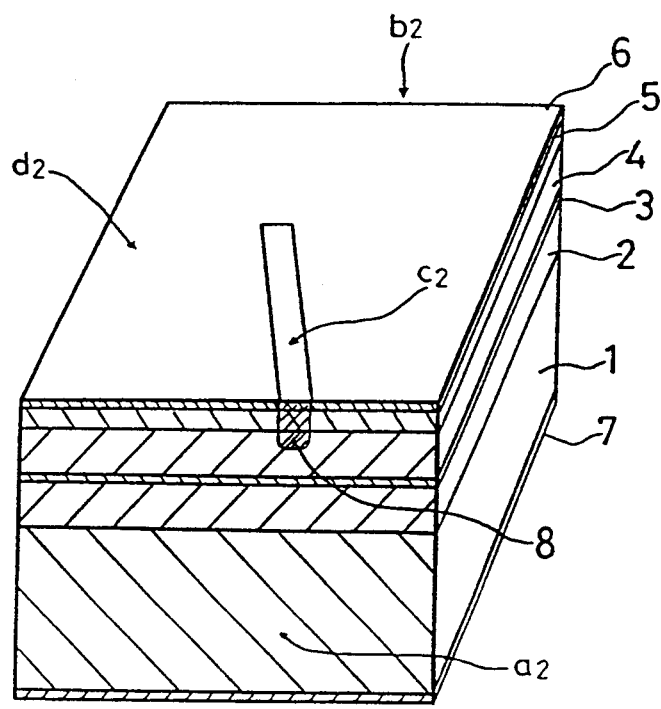
FIG. 1 is a perspective view showing a structure of an angled-stripe type SLD in accordance with an embodiment of the present invention.
Figure 2:
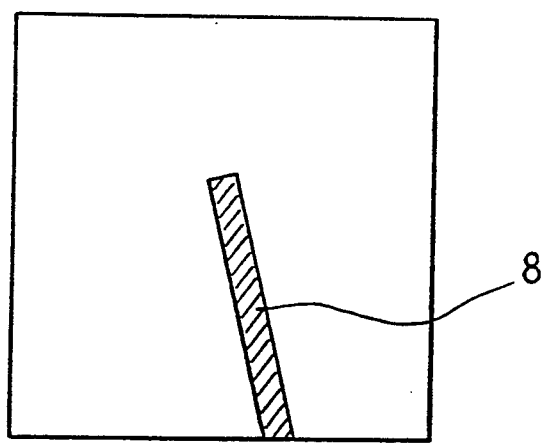
FIG. 2 is a plan view of the angled-stripe type SLD of FIG. 1.
Figure 6:
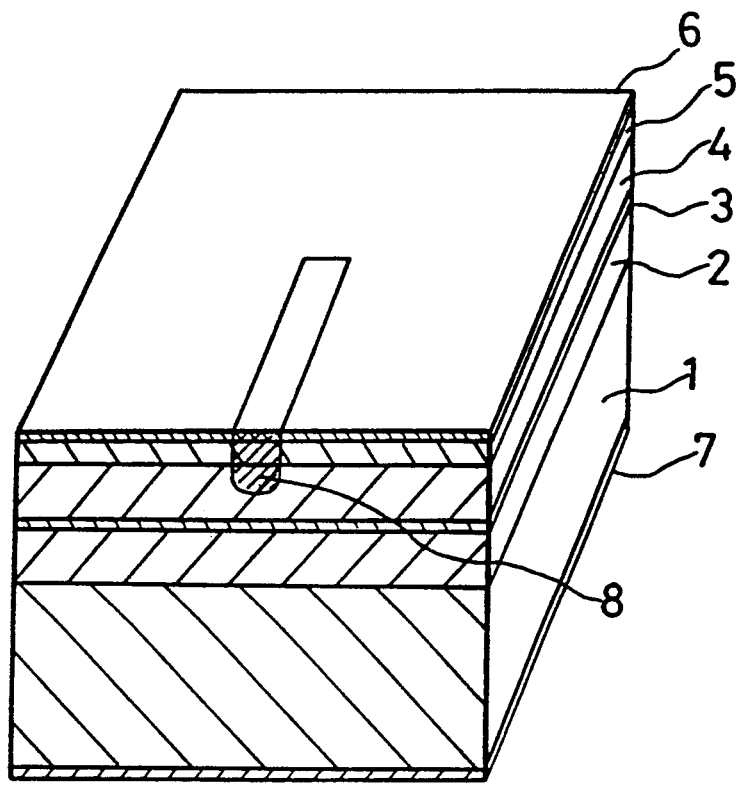
FIG. 6 is a perspective view showing a structure of the prior art non-excitation absorption type SLD.
Figure 7:
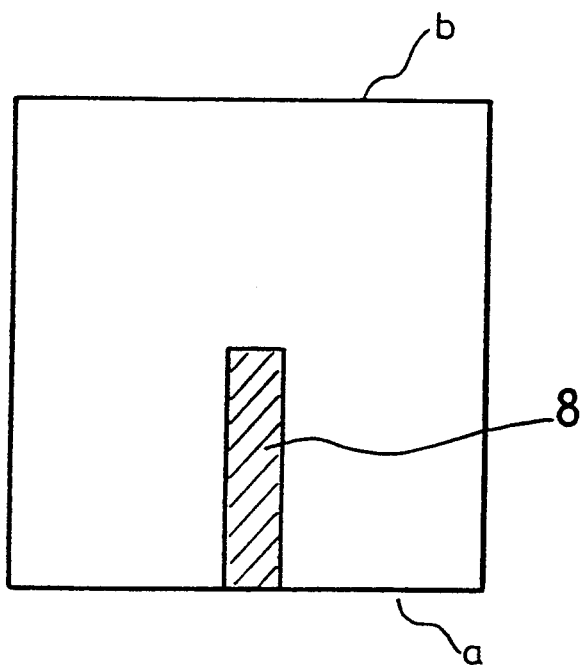
FIG. 7 is a plan view of the non-excitation absorption type SLD of FIG. 6.
Figure 8:
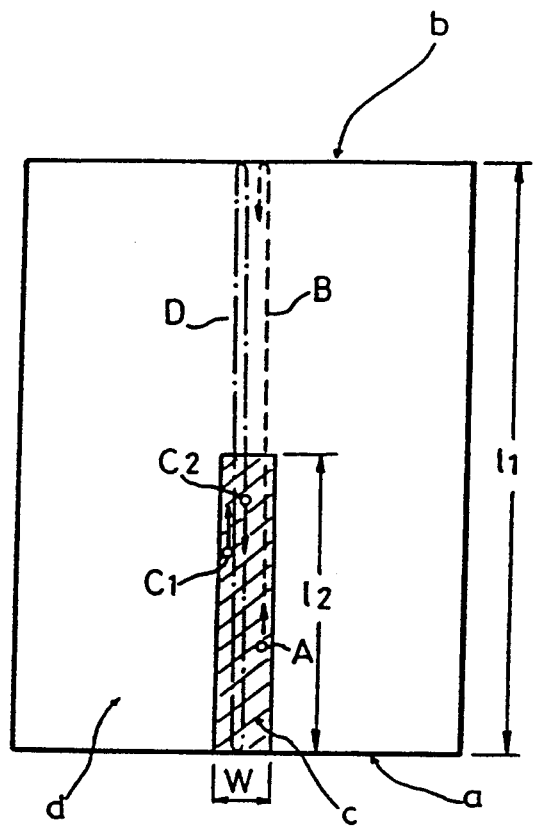
FIG. 8 is a plan view of the non-excitation absorption type SLD of FIG. 6, schematically illustrating light generated in the excitation region in the active layer.
Figure 9:
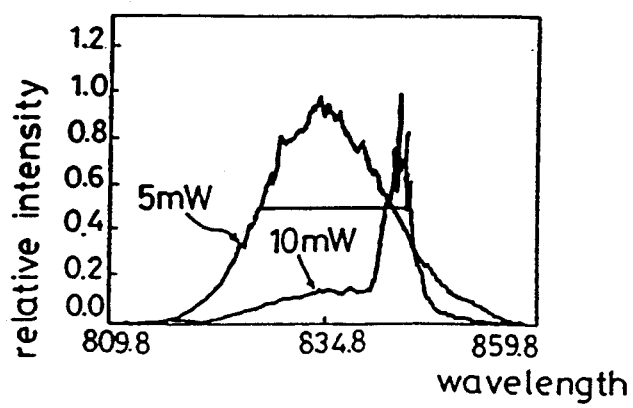
FIG. 9 is a graph showing output spectra of the nonexcitation absorption SLD of FIG. 6.
Figure 10:
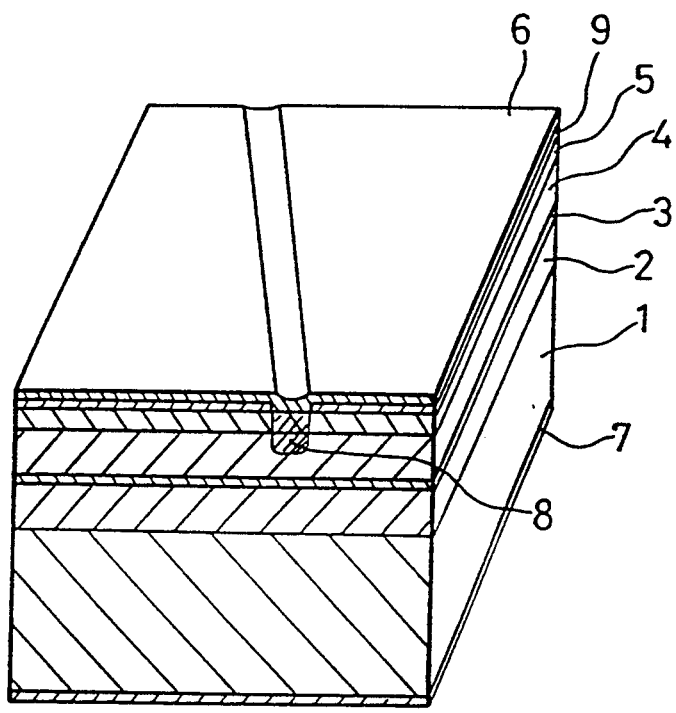
FIG. 10 is a perspective view showing a structure of the prior art angled-stripe type SLD.
Figure 11:
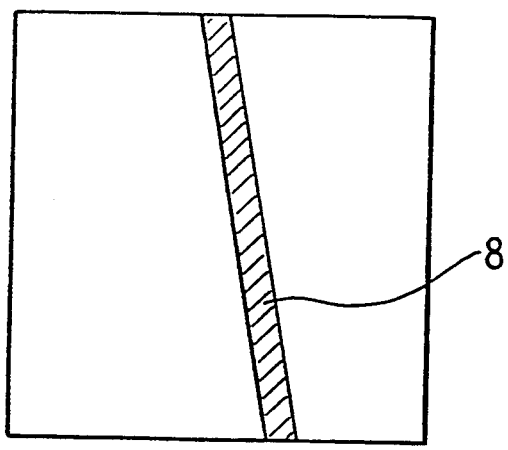
FIG. 11 is a plan view of the angled-stripe type SLD of FIG. 10.
Figure 12:
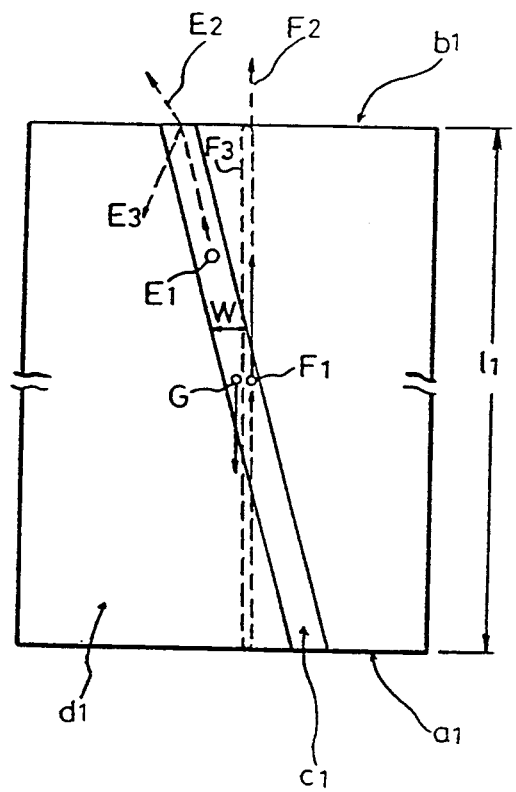
FIGS. 12 and 13 are plan views of the angled-stripe type SLD of FIG. 10, schematically illustrating light generated in the excitation region in the active layer.
Figure 13:
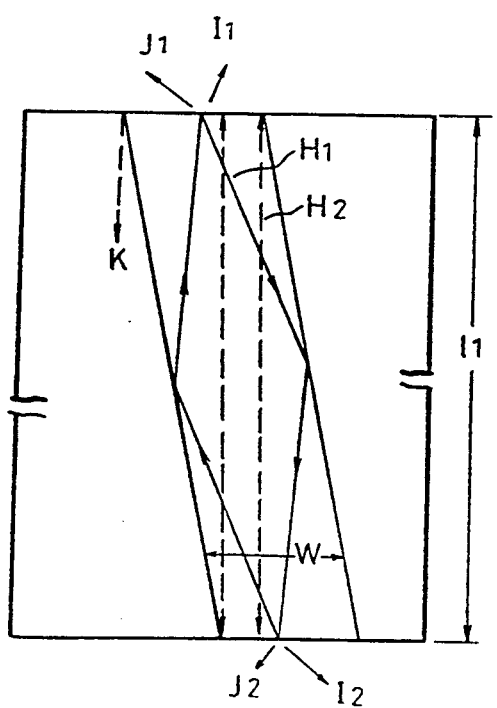
Figure 14A:
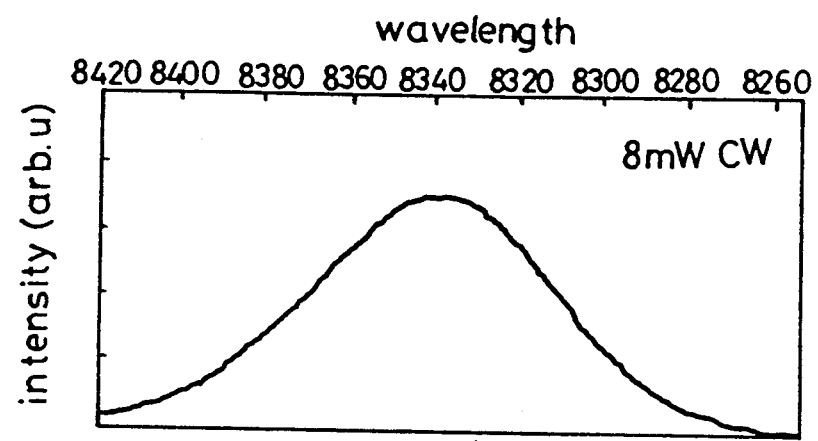
FIGS. 14(a) to 14(c) are graphs each showing an output spectrum of the angled-stripe type SLD of FIG. 12.
Figure 14B:
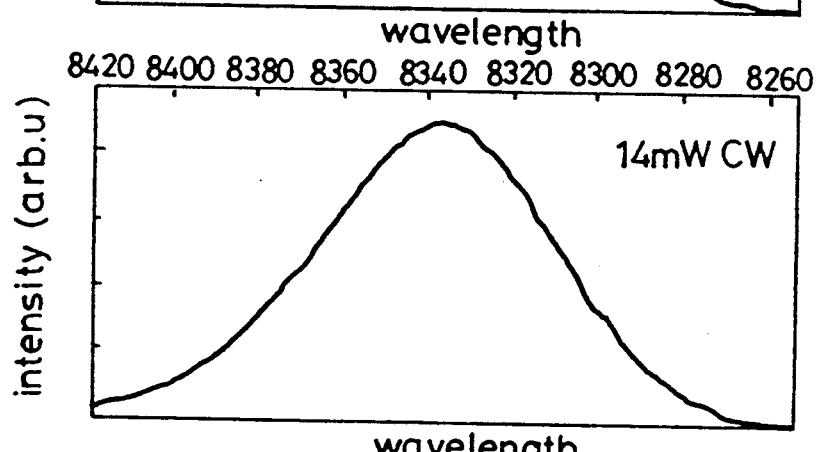
Figure 14C:
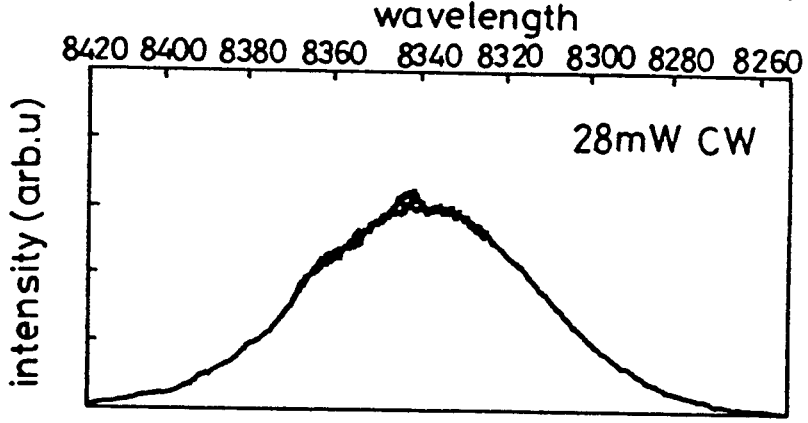

FIG. 1 is a perspective view showing an angled-stripe type SLD in accordance with an embodiment of the present invention. FIG. 2 is a plan view thereof. In FIG. 1, the same reference numerals as those shown in FIG. 6 designate the same parts. Reference characters $a_2$ and $b_2$ designate front and a rear facets, respectively, and characters $c_2$ and $d_2$ designate an excitation region and a non-excitation region, respectively. In this structure, the Zn diffusion region 8, i.e., the excitation region $c_2$, is inclined by 5° with respect to the front facet $a_2$, starts at the front facet $a_2$, and ends halfway between the front facet $a_2$ and the rear facet $b_2$ along the element length.

Operation will be described. When a forward bias voltage is applied across the p side electrode 6 and the n side electrode 7, i.e., a positive voltage is applied to the p side electrode 6 while a negative voltage is applied to the n side electrode 7, electrons and holes are injected into the active layer 3 beneath the Zn diffusion region 8 and light-emission and recombination of the electrons and holes occur in the active layer 3, whereby spontaneous emission light and induced emission light are emitted from the facets.

Figure 3:
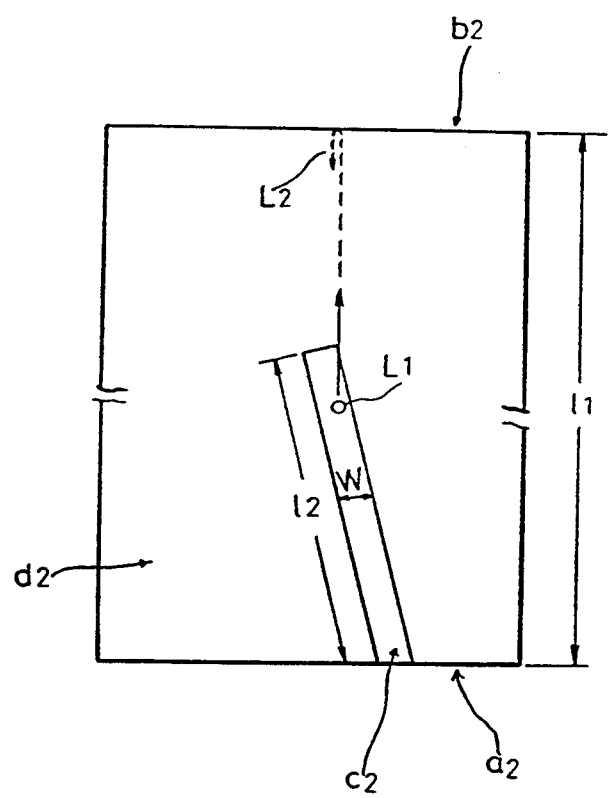
FIG. 3 is a plan view of the angled-stripe type SLD of FIG. 1, schematically illustrating light generated in the excitation region in the active layer.

FIG. 3 is a schematic diagram illustrating light generated in the excitation region $c_2$ in the active layer. A non-excitation region $d_2$ having an absorption function is provided in a region other than the excitation region $c_2$ and no current is injected into the non-excitation region $d_2$. The light $L_1$ generated in the excitation region $c_2$ and having directionality perpendicular to the facet $b_2$ is gradually absorbed by the non-excitation region $d_2$ while traveling therethrough and then it is reflected by the facet $b_2$. The reflected light $L_2$ is further absorbed by the non-excitation region $d_2$. Thereby, the repetition of reflection and amplification is decreased. As the result, even when the effective width of the Zn diffusion region 8 is about 30 to 40 microns or even in high power output operation, no laser oscillation occurs. In addition, the element length $l_1$ can be shortened.

Figure 4:
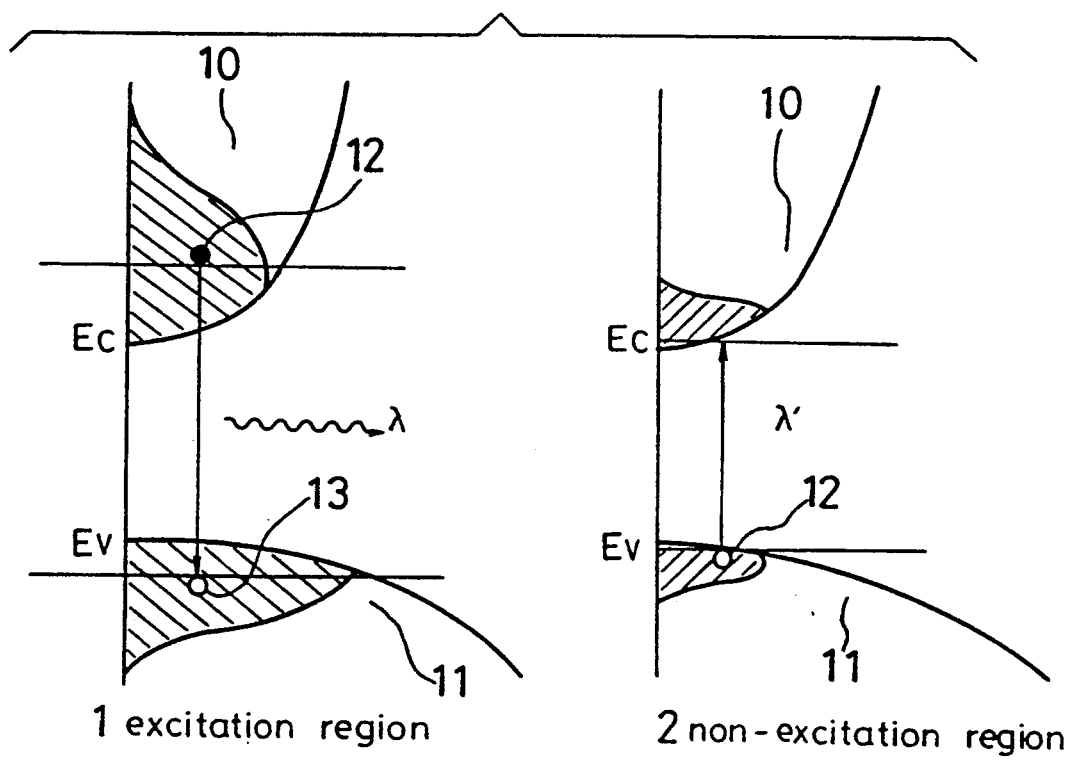
FIG. 4 is a schematic diagram illustrating energy band gaps in the active layer in the excitation region and the non-excitation region.

Description is given of a mechanism of the non-excitation region $d_2$ which absorbs light generated in the excitation region $c_2$. FIG. 4 is a schematic diagram illustrating energy band gaps in the active layer 3 in the excitation region $c_2$ and the non-excitation region $d_2$. In FIG. 4, reference character Ec designates an energy at the lower end of conduction band 10 and character Ev designates an energy at the upper end of valence band 11. Reference character $\lambda$ designates a wavelength of light generated by the light-emission and recombination of carriers in the excitation region $c_2$ and character $\lambda'$ designates a wavelength of light absorbed by the non-excitation region $d_2$.

Since current is injected into the excitation region $c_2$, electrons 12 and holes 13 (shown by hatching) are stored in the conduction band 10 and the valence band 11, respectively. In the excitation region $c_2$, a large number of transitions between a peak of the distribution of the electrons 12 in the conduction band 10 and a peak of the distribution of the holes 13 in the valence band 11, occur and a large number of recombinations of carriers, which generate light having wavelength $\lambda$, occur, resulting in a spectrum having a broad width with the wavelength $\lambda$ as the center.

Figure 5:
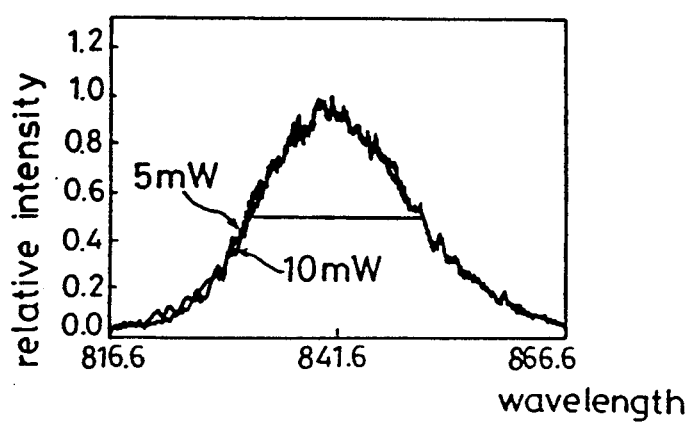
FIG. 5 is a graph showing output spectra of the angled-stripe type SLD of FIG. 1.

On the other hand, since no current is injected into the non-excitation region $d_2$, few electrons 12 and few holes 13 are stored in the conduction band 10 and the valence band 11, respectively. That is, the valence band 11 is filled with electrons 12 while few electrons 12 are stored in the conduction band 10. Light absorption is a phenomenon in which electrons 12 in the valence band 11 rise to the conduction band 11 in response to light. Accordingly, when fewer electrons 12 are stored in the conduction band 10 and more electrons 12 are stored in the valence band 11, the rate of light absorption becomes larger. In the non-excitation region $d_2$, light having an energy larger than the energy band gap, i.e., the gap between the energy at the lower end of the conduction band 10 and the energy at the upper end of the valence band 11, is effectively absorbed, and as the energy becomes larger, the rate of absorption becomes larger. The wavelength $\lambda'$ is always longer than the wavelength $\lambda$, i.e., the energy of the light generated by the light-emission and recombination of carriers in the excitation region $c_2$ is always larger than the energy band gap, so that the light traveling through the non-excitation region $d_2$ is absorbed therein. More specifically, the light generated in the excitation region $c_2$ is gradually absorbed by the non-excitation region $d_2$ while traveling therethrough and it is reflected by the rear facet $b_2$. Then, the greater part of the reflected light is absorbed by the nonexcitation region $d_2$. Therefore, the ratio of the light which returns to the excitation region $c_2$ becomes very small as compared with the case where the non-excitation region $d_2$ is absent. FIG. 5 shows an output spectrum of the SLD shown in FIG. 3 under continuous operation at output power levels of 5 mW and 10 mW where the element length $l_1$ is 500 microns, and the length $l_2$ and width W of the Zn diffusion region 8 are 320 microns and 5 microns, respectively.

According to an embodiment of the present invention, since the stripe-shaped excitation region $c_2$ is inclined by 5° with respect to the laser facets $a_2$ and $b_2$ and ends halfway between the front facet $a_2$ and the rear facet $b_2$, and the non-excitation region $d_2$ is formed at the rear facet $b_2$ side, the region from the end of the stripe up to the rear facet $b_2$ becomes the non-excitation region. Therefore, the repetition of reflection and amplification of the light having directionality perpendicular to the facets $a_2$ and $b_2$ is decreased and the effective reflection of light from both facets $a_2$ and $b_2$ is reduced. As the result, an SLD, that operates stably even in high power output operation without inviting laser oscillation and that can be produced at high yield, can be obtained.

While in the above-described embodiment Zn is used as a p type impurity for the diffusion region 8, silicon may be used as an n type impurity for that region when the conductivity types of the respective layers are inverted. Also in this case, the same effects as described above can be obtained.

In the above-described embodiment, the n type and p type cladding layers comprise $Al_{0.48}Ga_{0.52}As$ and the undoped active layer 3 comprises $Al_{0.05}Ga_{0.95}As$.

While in the above described embodiment the Zn diffusion region 8 is inclined by 5° with respect to the facet $a_2$, the angle $\theta$ of the Zn diffusion region 8 can be chosen from a range of $3° \leq \theta \leq 20°$ with the same effects as described above.

The above range of angle $\theta$ is set for the reasons discussed in the following.

Figure 15A:
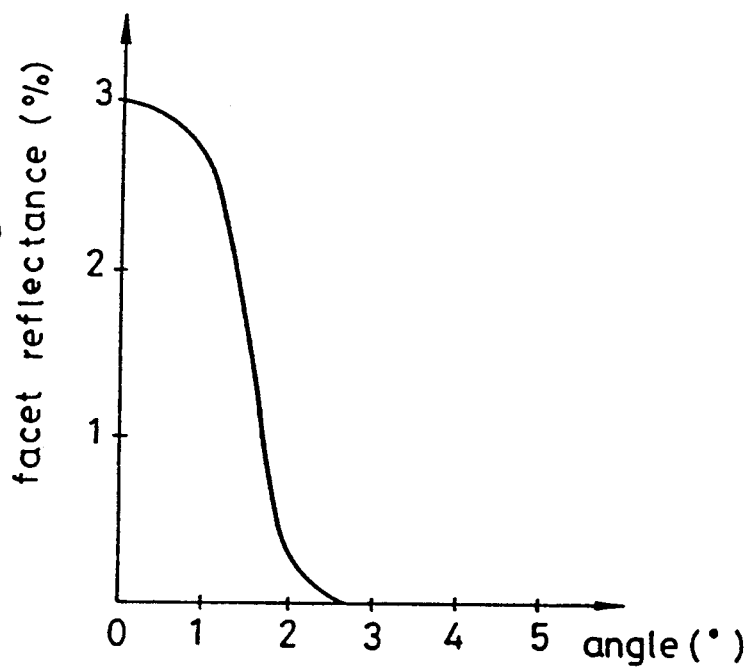
FIG. 15(a) is a graph showing a relation between facet reflectance and angle of the excitation region and FIG. 15(b) is a schematic diagram illustrating refraction and reflection of light.
Figure 15B:
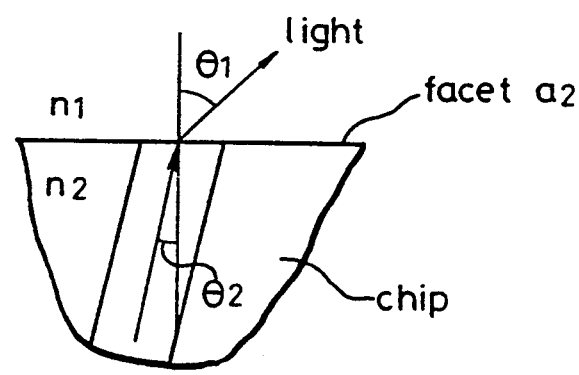
Figure 15B:
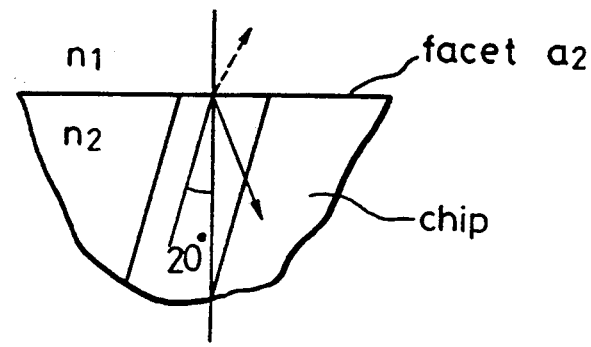

FIG. 15(a) is a graph showing a relation between reflectance of an AR(anti-reflection)-coated facet and the angle of the Zn diffusion region 8 with respect to the facet, and FIG. 15(b) schematically shows light which travels inside the chip toward the facet $a_2$ at an angle $\theta_2$ with respect to the facet $a_2$ and is refracted at an angle $\theta_1$ with respect to the facet $a_2$, according to Snell's law, when it is emitted.

The lower limit, i.e., 3°, is chosen because the effective reflectance is about 0% when the angle is about 3 or more, as shown in the graph of FIG. 15(a).

The upper limit, i.e., 20°, is chosen on the basis of Snell's law, with reference to FIG. 15(b) and the following equations.

$$n_1 \sin \theta_1 = n_2 \sin \theta_2$$

$n_1$: refractive index in air (approximately 1.0)
$n_2$: effective refractive index in AlGaAs (approximately 3.4)
$\theta_1$: direction of light emission outside the chip
$\theta_2$: angle of the stripe-shaped diffusion region
Accordingly, $$\sin \theta_2 = (n_1/n_2) \sin \theta_1$$

Since $\sin \theta_1$ is smaller than 1, $$\sin \theta_2 < n_1/n_2 = 1/3.4$$

$$\theta_2 \leq 17°$$

which means that the light is totally reflected in the chip if angle $\theta_2$ exceeds 17°. However, when the Al composition of AlGaAs of the active layer 3 is increased, the refractive index becomes smaller, so that the upper limit of angle $\theta_2$ can be set to 20° as shown in FIG. 15(b). Thus, the above range of the angle is determined.

As is evident from the foregoing description, according to the present invention, a SLD is provided with a stripe-shaped excitation region, which is inclined at an angle of 3 to 20 degrees with respect to the facets and ends halfway between the front facet and the rear facet, and a non-excitation region at the rear facet side. Therefore, repetition of reflection and amplification of light having a directionality perpendicular to the facets can be decreased and the effective reflection of light from the both faces can be decreased, resulting in an SLD that can operate stably even in high power output operation without inviting laser oscillation and that can be produced at high yield.

We claim:

1. A superluminescent diode comprising:
   a first conductivity type substrate;
   a double heterojunction structure comprising a first conductivity type cladding layer, an active layer, and a second conductivity type cladding layer successively disposed on said substrate;
   a first conductivity type cap layer disposed on said second conductivity type cladding layer, said double heterojunction structure and said cap layer having opposed front and rear facets transverse to said cap layer;
   a second conductivity type stripe-shaped diffusion region lying along a straight line, penetrating said cap layer, and reaching into said second conductivity type cladding layer wherein said stripe-shape diffusion region extends from the front facet toward but not reaching the rear facet and forms an angle of 3 to 20 degrees with respect to the front facet; and
   first and second electrodes disposed on said substrate and said cap layer, respectively.

2. The superluminescent diode of claim 1, wherein said first conductivity type is n type and said second conductivity type is p type.

3. The superluminescent diode of claim 1 wherein said first and second conductivity type cladding layers comprise $Al_xGa_{1-x}As$ and said active layer comprises $Al_yGa_{1-6}As$ ($x>y$).

4. The superluminescent diode of claim 1 having a length between the first and second facets of 300 to 500 microns.

5. The superluminescent diode of claim 1 wherein said stripe-shaped diffusion region contains a dopant impurity in a concentration of about $1 \times 10^{19}$ cm$^{-3}$.

6. The superluminescent diode of claim 1 wherein said active layer is undoped.

7. The superluminescent diode of claim 1 wherein said active layer is of a first conductivity type layer.

8. The superluminescent diode of claim 1 wherein said active layer is of a second conductivity type layer.

* * * * *